(12) United States Patent
Li et al.

(10) Patent No.: US 7,051,741 B2
(45) Date of Patent: May 30, 2006

(54) REDUCTION/OXIDATION MATERIAL REMOVAL METHOD

(75) Inventors: Li Li, Meridan, ID (US); Harlan Frankamp, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/094,103

(22) Filed: Mar. 8, 2002

(65) Prior Publication Data

US 2002/0134405 A1 Sep. 26, 2002

Related U.S. Application Data

(62) Division of application No. 09/642,427, filed on Aug. 21, 2000, now Pat. No. 6,412,497, which is a continuation of application No. 09/085,494, filed on May 27, 1998, now Pat. No. 6,105,588.

(51) Int. Cl.
*H01L 21/302* (2006.01)

(52) U.S. Cl. .......................... 134/1.1; 134/1.2; 438/725

(58) Field of Classification Search ............... 134/1.1, 134/1.2, 1.3, 26; 438/725, 906; 216/67
See application file for complete search history.

(56) References Cited

U.S. PATENT DOCUMENTS

| | | | |
|---|---|---|---|
| 4,619,836 A | 10/1986 | Prabhu et al. ................. 427/41 |
| 4,623,556 A | 11/1986 | Brown et al. ................. 427/41 |
| 4,699,689 A | 10/1987 | Bersin ....................... 438/709 |
| 4,711,836 A | 12/1987 | Ferreira ..................... 430/326 |
| 4,732,838 A | 3/1988 | Sechi et al. ................. 430/198 |
| 4,776,892 A | 10/1988 | Steppan et al. ............... 134/38 |
| 4,867,799 A | 9/1989 | Grebinski ................... 134/11 |
| 4,873,177 A | 10/1989 | Tanaka et al. ............... 430/326 |
| 4,961,820 A | 10/1990 | Shinagawa et al. ......... 438/725 |
| 5,007,983 A | 4/1991 | Lerner et al. ................ 134/1.2 |
| 5,057,187 A | 10/1991 | Shinagawa et al. ......... 438/725 |
| 5,201,960 A * | 4/1993 | Starov ....................... 134/11 |
| 5,296,093 A | 3/1994 | Szwejkowski et al. ....... 156/643 |
| 5,545,309 A | 8/1996 | Shimizu et al. ............. 205/437 |
| 5,567,574 A | 10/1996 | Hasemi et al. .............. 430/331 |
| 5,773,201 A | 6/1998 | Fujimura et al. ........... 430/329 |
| 5,882,489 A | 3/1999 | Bersin et al. ............... 438/725 |
| 5,885,361 A * | 3/1999 | Kikuchi et al. ............. 134/1.1 |
| 5,888,309 A | 3/1999 | Yu ........................... 134/1.2 |
| 5,925,501 A | 7/1999 | Zhang et al. ................ 134/1.2 |
| 6,105,588 A * | 8/2000 | Li et al. ..................... 134/1.1 |
| 6,242,054 B1 | 6/2001 | Baalmann et al. .......... 427/489 |
| 6,412,497 B1 * | 7/2002 | Li et al. ..................... 134/1.1 |

* cited by examiner

*Primary Examiner*—Michael Barr
*Assistant Examiner*—Saeed Chaudhry
(74) *Attorney, Agent, or Firm*—TraskBritt

(57) ABSTRACT

A method of resist stripping for use during fabrication of semiconductor devices. A semiconductor substrate with a resist material formed thereon, such as a silicon wafer, is positioned in a sealed chamber in communication with a plasma-generating source. A gaseous material which includes a reducing agent is passed through the plasma-generating source to produce a plasma stream. The plasma stream is directed at the semiconductor substrate for a predetermined period of time to remove the resist material from the semiconductor substrate. A reducing environment is produced in the sealed chamber by the plasma stream, which can passivate and strip the resist material simultaneously.

20 Claims, 1 Drawing Sheet

REDUCTION/OXIDATION MATERIAL REMOVAL METHOD

This is a divisional of U.S. patent application Ser. No. 09/642,427, filed on Aug. 21, 2000, entitled "Reduction/Oxidation Material Removal Method", now U.S. Pat. No. 6,412,497 B1, issued Jul. 2, 2002 which is a continuation of U.S. patent application Ser. No. 09/085,494, filed on May 27, 1998, entitled "Method of Resist Stripping During Semiconductor Device Fabrication", now U.S. Pat. No. 6,105,588, issued Aug. 22, 2000, both of which are incorporated herein by reference.

BACKGROUND OF THE INVENTION

1. The Field of the Invention

The present invention relates to methods for manufacturing semiconductor devices. More particularly, the present invention relates to a method of resist stripping for use during fabrication of semiconductor devices.

2. The Relevant Technology

During the processing of semiconductor wafers used in the manufacture of integrated circuits and other semiconductor devices, it is necessary in various processing steps to etch or strip certain areas of the wafer to remove photoresist coatings applied to the wafer and to otherwise clean the wafer. The removal of photoresist coatings by a stripping process typically leaves a residue of resist material on the wafer that can be difficult to remove in a subsequent cleaning process.

Conventional processes for cleaning semiconductor wafers include contacting the wafer with a liquid solvent of a desired composition such as an organic solvent. The composition may be stirred or otherwise caused to flow across or against the surfaces of the wafers to provide a washing action. Cleaning of the wafer utilizing such liquid solvents is typically done by dipping the wafer in a bath of the liquid solvent.

Resist materials have been typically removed from wafers in the past by utilizing a variety of liquid chemical compounds and mixtures. There are several drawbacks with the use of liquid stripping compositions to remove photoresist materials. These include not being able to remove deep UV-baked, implant-hardened or plasma-hardened photoresist. In addition, use of liquid stripping compositions can leave behind traces of resist film on the wafer as well as non-dissolved yield-limiting contaminants originating from the liquid stripping compositions on the wafer.

A resist stripping method utilizing vaporized stripping compositions is disclosed in U.S. Pat. No. 4,867,799 to Grebinski. The method includes positioning a wafer within a treating chamber with the surface to be treated exposed. Ammonia vapor is contacted with water vapor and/or hydrogen peroxide vapor adjacent to the surface of the wafer to provide a hot mixture comprising at least ammonia and ammonium hydroxide that is impinged on the surface of the wafer. The contacting of the ammonia with water and/or hydrogen peroxide is immediately prior to and/or simultaneous with the impinging step.

Other conventional resist strip technologies typically use large amounts of oxygen ($O_2$) to perform the stripping step. The addition of water to $O_2$ to passivate and strip metal-etched wafers has also been widely used in the industry.

Other methods of stripping resist coatings utilize $O_2$ plasmas, or combinations of a plasma step and then a liquid acid dip. For example, a microwave stripper system utilizes microwave-induced plasma of atomic oxygen at low pressure to strip photoresist from a wafer. Other components such as water and nitrogen can also be used in the microwave stripper system, in either a single step with oxygen or in a two-step process including passivation and stripping.

Since resist materials are typically made of hydrocarbon polymers, the oxygen utilized in the above resist stripping techniques reacts with carbon in the polymers to form strong carbon-oxygen bonds. Although the oxygen etches the resist very fast, a residue is left having carbon-oxygen bonds, which is difficult to remove in a subsequent cleaning process. The resist is also dehydrated by reaction with the oxygen, which further hardens the remaining residue.

Accordingly, there is a need for improved methods that overcome or avoid the above problems and difficulties.

SUMMARY OF THE INVENTION

The present invention is directed to a method of resist stripping for use during fabrication of semiconductor devices. A semiconductor substrate with a resist material formed thereon, such as a silicon wafer, is positioned in a sealed chamber at low pressure in communication with a plasma-generating source. A gaseous material that includes a reducing agent such as ammonia is passed through the plasma-generating source to produce a plasma stream. The plasma stream is directed at the semiconductor substrate for a predetermined period of time to substantially remove the resist material from the semiconductor substrate. A reducing environment is produced in the sealed chamber by the plasma stream, which can passivate and strip the resist material simultaneously. A conventional wafer-cleaning operation can then be easily employed to remove any remaining residue of resist material on the substrate.

The plasma stream utilized in the present invention contains reactive species of ions and radicals that are produced from the gas components of the gaseous material used in is forming the plasma stream. The gaseous material used to produce the plasma stream can include various combinations of gas components such as ammonia, water, oxygen, and other optional components Optionally, the method of the invention can be used in conjunction with another processing step which utilizes a different gaseous material that includes an oxidizing agent to produce another plasma stream. Accordingly, a first gaseous material including a reducing agent is passed through the plasma-generating source to produce a first plasma stream, which is directed at the semiconductor substrate for a predetermined period of time to remove a desired amount of resist material. A second gaseous material including an oxidizing agent is passed through the plasma-generating source to produce a second plasma stream, which is directed at the semiconductor substrate. The second plasma stream produces an oxidizing environment in the sealed chamber and more quickly strips the resist material.

Other aspects and features of the present invention will become more fully apparent from the following description and appended claims, or may be learned by the practice of the invention as set forth hereinafter.

BRIEF DESCRIPTION OF THE DRAWINGS

In order to more fully understand the manner in which the above-recited and other advantages and features of the invention are obtained, a more particular description of the invention briefly described above will be rendered by reference to a specific embodiment thereof, which is illustrated in the appended drawing. Understanding that the drawing depicts only a typical embodiment of the invention and is not, therefore, to be considered limiting of its scope, the invention will be described and explained with additional specificity and detail through the use of the accompanying drawing in which.

DETAILED DESCRIPTION OF THE INVENTION

Figure 1:
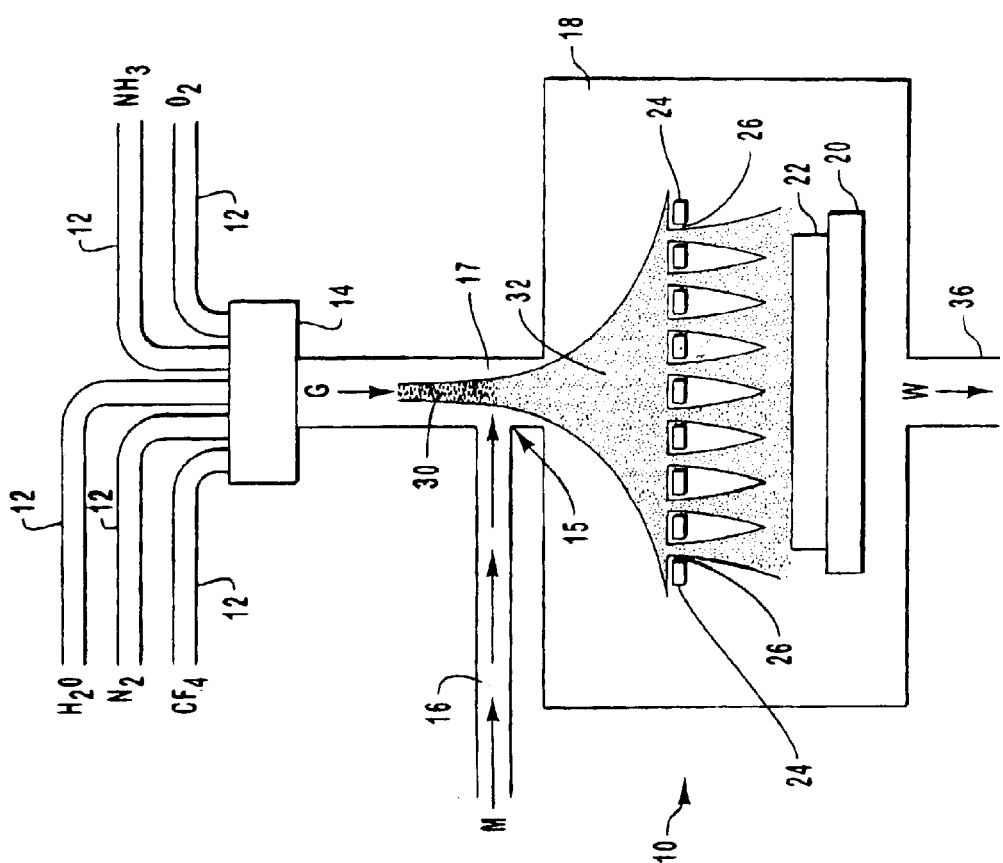
FIG. 1 is a schematic depiction of a resist stripping system that can be employed to practice the method of the present invention.

The present invention is directed to a method of resist stripping for use during fabrication of semiconductor devices. The method of the invention includes a stripping/passivation step for removing a resist material such as a polymeric photoresist from a semiconductor substrate such as a silicon wafer. Preferably, a one-step process is employed that passivates and strips the resist material simultaneously. The one-step process utilizes a plasma stream which is generated to create reactive species for the passivation and stripping process for substantially removing the resist material. A conventional wafer-cleaning operation can then be easily employed to remove any remaining residue of resist material on the semiconductor substrate.

As used herein, the term "semiconductor substrate" is defined to mean any construction comprising semiconductive material including, but not limited to, bulk semiconductive material such as a semiconductive wafer, either alone or in assemblies comprising other materials thereon, and semiconductive material layers, either alone or in assemblies comprising other materials. The term "substrate" refers to any supporting structure including, but not limited to, the semiconductor substrates described above.

In one method of the invention that employs a one-step process, a semiconductor substrate such as a silicon wafer with a resist material formed thereon is positioned in a low-pressure sealed chamber in communication with a plasma-generating source. A gaseous material including a reducing agent is passed through the plasma-generating source to produce a plasma stream containing reactive species of ions and radicals. The plasma stream produces a reducing environment in the sealed chamber and is directed at the wafer for a predetermined period of time to strip the photoresist pattern on the wafer. The plasma stream can also simultaneously passivate exposed surfaces of the wafer depending on the layer materials formed on the wafer.

Optionally, the above method can be used in conjunction with another processing step that utilizes a gaseous material including an oxidizing agent, such as oxygen, and other optional gas components, which are passed through the plasma-generating source to produce another plasma stream. This plasma stream produces an oxidizing environment in the sealed chamber and is directed at the wafer for a predetermined period of time to more quickly strip and remove the resist material from the wafer. The additional processing step can be performed either previous or subsequent to the reducing plasma step described above.

The reducing agent utilized in the method of the invention can be selected from various chemical compounds, such as ammonia ($NH_3$), hydrazine ($HN=NH$ or $H_2N-NH_2$), mixtures thereof, and the like. Preferably, the reducing agent is present in the gaseous material in an amount greater than or equal to the other components in the gaseous material, in order to provide a reducing ambient or environment to which the wafer is exposed during the stripping/passivation step. This prevents formation of strong carbon-oxygen bonds in the residual resist material during the stripping step, such that any residue of resist material left on the wafer after stripping is relatively soft and thus easy to remove in a conventional cleaning operation.

The gaseous environment can also include water in order to prevent dehydration of the resist material during the stripping process so that any resist material residue does not become hardened on the wafer, but remains relatively soft for easy subsequent cleaning. For example, a gaseous mixture of ammonia and water can be used in a passivation and resist stripping process after a dry etch process has been performed on a wafer. Preferably, the ratio of ammonia to water in the gaseous mixture is greater than about 1.

Other gas components can be optionally added to the gaseous environment for a particular purpose. For example, oxygen can be used in place of water or can be combined with water in the gaseous environment as long as the reducing agent is present in an amount to maintain a reducing environment. Thus, the ratio of ammonia to oxygen or to water and oxygen in the first gaseous mixture is preferably greater than about 1. In addition, small amounts of fluorine-containing compounds can be added to the gaseous materials for passivation of metals. For example, carbon tetrafluoride ($CF_4$) can be added to the gaseous material for performing a resist strip after a metal etch to prevent metal voiding. Other components, such as nitrogen and argon, can also be added to the gaseous material. Additionally, one or more of the above gas components can be combined in a variety of mixtures as desired.

The plasma stream utilized in the present invention can be produced by any type of plasma source, such as a downstream microwave system, an electron cyclotron residence (ECR) system, an inductive-coupled plasma (ICP) system, a radio frequency (RF) system, etc. The plasma stream contains reactive species of ions and radicals from the gas components in the gaseous material, such as $NH_2$, $NH$, $N$, $C$, $F$, $OH$, $H$, and the like, which react with the exposed resist material on the wafer during the stripping/passivation step.

Referring to the drawing, FIG. 1 is a schematic depiction of a resist stripper system 10 which can be used to practice the method of the present invention. The system 10 includes various gas lines 12 that communicate with a manifold 14 for mixing various gaseous materials from gas lines 12. For example, a preselected amount of ammonia vapor and water vapor can be directed to manifold 14 from gas lines 12 to form a gaseous mixture in manifold 14. Other gas lines 12 for oxygen, nitrogen, carbon tetrafluoride, or other gases may also be employed in system 10.

A plasma-generating section 15 is in communication with manifold 14 and includes a plasma-generating source. For example, a source of electromagnetic radiation can be used to direct radiative energy at a gas stream flowing from manifold 14 to form a plasma-enhanced gaseous material. In one embodiment, a microwave generator (not shown) for producing microwaves can be utilized in plasma-generating section 15 to direct microwave energy indicated by arrows M through a channel 16 at the gas flow indicated by arrow G flowing through a passageway 17 from manifold 14 to produce a plasma stream 32.

A sealed chamber 18 is provided that communicates with passageway 17. Within sealed chamber 18 is a bottom electrode 20 that is configured to support a semiconductor substrate, such as a silicon wafer 22. A baffle 24 with a plurality of openings 26 is positioned above bottom electrode 20. The baffle 24 uniformly distributes plasma stream 32 against the exposed surface of wafer 22.

In operating system 10, according to the method of the present invention, wafer 22 with a resist material formed thereon is placed on bottom electrode 20 within sealed chamber 18 under a very low-pressure regime. For example, sealed chamber 18 can have a pressure of from about 0.5 Torr to about 5 Torr, and preferably from about 2 Torr to about 4 Torr. The bottom electrode 20 heats the semiconductor substrate to a temperature from about 100° C. to about 350° C., and preferably from about 200° C. to about 300° C. A gaseous material 30 including a reducing agent, such as ammonia, is directed to manifold 14 from one or more gas lines 12. The amount of the reducing agent used can be from about 100 to about standard cubic centimeters (sccm) to about 3000 (sccm), and preferably from about 300 sccm, to about 1000 sccm. Other gas components such as water and/or oxygen can be added to gaseous material 30 as discussed above to carry out a stripping/passivation step as desired.

The gaseous material 30 is directed through plasma-generating section 15 to produce plasma stream 32, which includes ionized gas containing reactive species. The plasma stream 32 preferably provides a reducing environment in sealed chamber 18. The plasma stream 32 is directed at wafer 22 through baffle 24 for a predetermined period of time to 32 can be directed at wafer 22 for a period of time from about 10 seconds to about 10 minutes, and preferably from about 20 seconds to about 100 seconds. The plasma stream 32 can simultaneously passivate exposed surfaces of the wafer 22 and remove the resist material from wafer 22. Waste products indicated by arrow W from the stripping process are then directed through an outlet 36 at the bottom of sealed chamber 18 and pumped to a waste disposal area (not shown).

The system 10 can also be used to perform a previous or subsequent optional processing step in conjunction with the above reducing plasma step. The optional processing step utilizes a gaseous material that includes an oxidizing agent in an amount to provide an oxidizing environment in sealed chamber 18. For example, a gaseous material 30 including oxygen is directed to manifold 14 from one or more gas lines 12. The gaseous material 30 is then directed through plasma-generating section 15 to produce plasma stream 32, which includes ionized gas containing reactive species. The plasma stream 32 produces an oxidizing environment in sealed chamber 18. The plasma stream 32 is directed at wafer 22 through baffle 24 for a predetermined period of time to strip the resist material on wafer 22.

The present invention provides significant benefits over conventional resist stripping processes. The method of the present invention removes a resist material from a substrate such that any resist residue on the substrate after the strip is much easier to remove in a subsequent cleaning process. This allows a conventional cleaning operation to be easily employed to remove any remaining residue of resist material on the substrate. Further, the method of the invention can be applied in a variety of different tools, applications, and processes during semiconductor device fabrication.

The following examples set forth processing conditions for various resist stripping methods within the scope of the present invention. These examples are intended to be purely exemplary and should not be viewed as limiting the scope of the invention.

EXAMPLE 1

A one-step resist stripping method was carried out in a microwave stripper system according to the present invention. The following process parameters in the indicated amounts were utilized during the stripping/passivation step.

| Process Parameter | Stripping/Passivation Step |
| --- | --- |
| Pressure | 3.0 Torr |
| RF Power | 1500 watts |
| $O_2$ Flow | 0 sccm |
| $NH_3$ Flow | 500 sccm |
| $CF_4$ Flow | 0 sccm |
| $N_2$ Flow | 0 sccm |
| Time | 100 sec |
| Resist Etch Rate | Approx. 1.0 µm/min |
| Bottom Electrode Temp. | 250° C. |

The above processing conditions resulted in an effective removal of resist material from a semiconductor substrate without leaving a hardened residue on the substrate.

EXAMPLE 2

A one-step resist stripping method is carried out in a microwave stripper system according to the present invention. The following process parameters in the indicated amounts are utilized during the stripping/passivation step.

| Process Parameter | Stripping/Passivation Step |
| --- | --- |
| Pressure | 2.0 Torr |
| RF Power | 1500 watts |
| $O_2$ Flow | 0 sccm |
| $NH_3$ Flow | 500 sccm |
| $H_2O$ Flow | 400 sccm |
| $N_2$ Flow | 0 sccm |
| Time | 80 sec |
| Resist Etch Rate | Approx. 1.0 µm/min |
| Bottom Electrode Temp. | 250° C. |

The above processing conditions result in an effective removal of resist material from a semiconductor substrate without leaving a hardened residue on the substrate.

EXAMPLE 3

A one-step resist stripping method is carried out in a microwave stripper system according to the present invention. The following process parameters in the indicated amounts are utilized during the stripping/passivation step.

| Parameter | Stripping/Passivation Step |
| --- | --- |
| Pressure | 2.0 Torr |
| RF Power | 1500 watts |
| $O_2$ Flow | 800 sccm |
| $NH_3$ Flow | 1000 sccm |
| $H_2O$ Flow | 800 sccm |
| $N_2$ Flow | 200 sccm |
| Time | 80 sec |
| Resist Etch Rate | Approx. 3.0 µm/min |
| Bottom Electrode Temp. | 250° C. |

The above processing conditions result in an effective removal of resist material from a semiconductor substrate without leaving a hardened residue on the substrate.

EXAMPLE 4

A one-step resist stripping method is carried out in a microwave stripper system according to the present invention. The following process parameters in the indicated amounts are utilized during the stripping/passivation step.

| Parameter | Stripping/Passivation Step |
| --- | --- |
| Pressure | 2.0 Torr |
| RF Power | 1500 watts |
| $O_2$ Flow | 800 sccm |
| $NH_3$ Flow | 1000 sccm |
| $H_2O$ Flow | 800 sccm |
| $CF_4$ Flow | 50 sccm |
| $N_2$ Flow | 200 sccm |
| Time | 80 sec |
| Resist Etch Rate | Approx. 3.0 µm/min |
| Bottom Electrode Temp. | 250° C. |

The above processing conditions result in an effective removal of resist material from a semiconductor substrate without leaving a hardened residue on the substrate.

The present invention may be embodied in other specific forms without departing from its spirit or essential characteristics. The described embodiments are to be considered in all respects only as illustrative and not restrictive. The scope

What is claimed and desired to be secured by United States Letters Patent is:

1. A method of removing an organic material on a substrate, the method comprising:
   exposing an organic material on a substrate to a reducing environment produced by a first plasma stream; and then
   exposing the organic material to an oxidizing environment produced by a second plasma stream to remove the organic material from the substrate.

2. The method as defined in claim 1, wherein: exposing an organic material on a substrate to a reducing environment comprises the organic material to a reducing environment that includes a reducing agent and oxygen, wherein an amount of the reducing agent in the reducing environment is not less than the amount of the oxygen in the reducing environment.

3. The method as defined in claim 1 wherein: exposing and organic material on a substrate to a reducing environment comprises exposing the organic material to a reducing environment that comprises a reducing agent, water and oxygen, wherein an amount of the reducing agent in the reducing environment is not less than the total amount of both the oxygen and the water in the reducing environment.

4. The method as defined in claim 1, wherein exposing an organic material on a substrate to a reducing environment comprises exposing an organic material that is structurally altered by exposure to light to a reducing environment.

5. The method as defined in claim 1, wherein exposing an organic material on a substrate to a reducing environment comprises exposing the organic material to a reducing environment that comprises an agent selected from the group consisting of ammonia, hydrazine, and mixtures thereof.

6. The method as defined in claim 5, wherein exposing an organic material on a substrate to a reducing environment comprises exposing the organic material to a reducing environment that further comprises an agent selected from the group consisting of water, oxygen, and mixtures therof.

7. The method as defined in claim 6, wherein exposing an organic material on a substrate to a reducing environment comprises exposing the organic material to a reducing environment that further comprises an agent selected from the group consisting of nitrogen, argon, carbon tetrafluoride, and mixtures thereof.

8. The method as defined in claim 1, wherein exposing the organic material to an oxidizing environment comprises exposing the organic material to an oxidizing environment that comprises oxygen.

9. The method as defined in claim 1, wherein exposing an organic material to a reducing environment comprises exposing a photoresist material to the reducing environment.

10. The method as defined in claim 1, wherein at least one of the reducing environment and said oxidizing environment comprises at least one of water, oxygen, nitrogen, argon, a fluorine-containing substance, and mixtures thereof.

11. A method of removing a masking material, the method comprising:
   exposing the masking material to a reducing environment produced by a first plasma stream, the masking material being situated upon a surface that does not comprise the masking material; and then
   exposing the masking material to an oxidizing environment produced by a second plasma stream to remove the masking material from the surface.

12. The method as defined in claim 11, wherein:
   exposing a masking material to a reducing environment comprises exposing the masking material to a reducing environment that comprises a reducing agent and oxygen, wherein an an amount of the reducing agent in the reducing environment is not less than the amount of the oxygen in the reducing environment.

13. The method as defined in claim 11, wherein: exposing a masking material to a reducing environment comprises a reducing agent, water and oxygen, wherein an amount of the reducing agent in the reducing environment is not less not less than a total amount of both the oxygen and the water in the reducing environment.

14. The method as defined in claim 11, wherein exposing a masking material to a reducing environment comprises exposing the masking material that is structurally altered by exposure to light to the reducing environment.

15. The method as defined in claim 11, wherein exposing a masking material to a reducing environment comprises exposing the masking material to a reducing environment that comprises an agent selected from the group consisting of ammonia, hydrazine, and mixtures thereof.

16. The method as defined in claim 15, wherein exposing a masking material to a reducing environment comprises exposing the masking material to a reducing environment further comprises an agent selected from the group consisting of water, oxygen, and mixtures thereof.

17. The method as defined in claim 16, wherein exposing a masking material to a reducing environment comprises exposing the masking material to a reducing environment that further comprises an agent selected from the group consisting of nitrogen, argon, carbon tetrafluoride, and mixtures thereof.

18. The method as defined in claim 11, wherein exposing the masking material to an oxidizing environment comprises exposing the oxidizing environment that comprises the masking material to an oxygen.

19. The method as defined in claim 11, wherein at least one of the reducing environment and the oxidizing environment comprises at least one of water, oxygen, nitrogen, argon, a fluorine-containing substance, and mixtures thereof.

20. The method as defined in claim 19, wherein the fluorine-containing substance comprises carbon tetrafluoride.

* * * * *

UNITED STATES PATENT AND TRADEMARK OFFICE
CERTIFICATE OF CORRECTION

PATENT NO. : 7,051,741 B2  Page 1 of 2
APPLICATION NO. : 10/094103
DATED : May 30, 2006
INVENTOR(S) : Li Li and Harlan Frankamp It is certified that error appears in the above-identified patent and that said Letters Patent is hereby corrected as shown below:

In the specification:

| | | |
|---|---|---|
| COLUMN 1, | LINE 6, | change "Method"," to --Method,"-- |
| COLUMN 1, | LINE 7, | after "2002" and before "which" insert a comma --,-- |
| COLUMN 1, | LINE 10, | change "Fabrication"," to --Fabrication,"-- |
| COLUMN 5, | LINE 7, | change "time to 32" to --time to strip the desired amount of resist material from wafer 22. For example, the plasma stream 32-- |

In the claims:

| | | | |
|---|---|---|---|
| CLAIM 2, | COLUMN 7, | LINE 15, | after "wherein:" delete "exposing an" |
| CLAIM 2, | COLUMN 7, | LINE 16, | insert --exposing an-- at the beginning of the sentence before "organic" |
| CLAIM 2, | COLUMN 7, | LINE 17, | change "comprises the organic material to a reducing environment" to --comprises exposing the organic material to a reducing environment-- |
| CLAIM 3, | COLUMN 7, | LINE 22, | after "claim 1" and before "wherein:" insert a comma --,-- and after "wherein:" delete "exposing" |
| CLAIM 3, | COLUMN 7, | LINE 23, | insert --exposing-- at the beginning of the sentence and before "organic" change "and" to --an-- |
| CLAIM 6, | COLUMN 7, | LINE 42, | change "therof." to --thereof.-- |
| CLAIM 10, | COLUMN 7, | LINE 56, | change "said" to --the-- |
| CLAIM 11, | COLUMN 8, | LINE 5, | change "the" to --a-- |
| CLAIM 12, | COLUMN 8, | LINE 17, | delete second occurrence of "an" |
| CLAIM 13, | COLUMN 8, | LINE 20, | after "wherein:" delete "exposing" |
| CLAIM 13, | COLUMN 8, | LINE 21, | insert --exposing-- at beginning of sentence before "a" |
| CLAIM 13, | COLUMN 8, | LINE 21, | after "comprises" and before "a" insert --exposing the masking material to a reducing environment that comprises-- |

UNITED STATES PATENT AND TRADEMARK OFFICE
CERTIFICATE OF CORRECTION

PATENT NO. : 7,051,741 B2
APPLICATION NO. : 10/094103
DATED : May 30, 2006
INVENTOR(S) : Li Li and Harlan Frankamp It is certified that error appears in the above-identified patent and that said Letters Patent is hereby corrected as shown below:

In the claims (continued):
CLAIM 13, COLUMN 8, LINES 23-24, delete second occurrence of "not less"

Signed and Sealed this

Sixth Day of March, 2007

JON W. DUDAS
*Director of the United States Patent and Trademark Office*